US008339895B2

(12) United States Patent
Ware et al.

(10) Patent No.: US 8,339,895 B2
(45) Date of Patent: Dec. 25, 2012

(54) SIGNAL CALIBRATION METHODS AND APPARATUSES

(75) Inventors: Frederick A. Ware, Los Altos Hills, CA (US); Reza Navid, Mountain View, CA (US); John W. Poulton, Chapel Hill, NC (US)

(73) Assignee: Rambus Inc., Sunnyvale, CA (US)

( * ) Notice: Subject to any disclaimer, the term of this patent is extended or adjusted under 35 U.S.C. 154(b) by 198 days.

(21) Appl. No.: 13/061,519

(22) PCT Filed: Aug. 27, 2009

(86) PCT No.: PCT/US2009/055106

§ 371 (c)(1), (2), (4) Date: Mar. 1, 2011

(87) PCT Pub. No.: WO2010/039365

PCT Pub. Date: Apr. 8, 2010

(65) Prior Publication Data

US 2011/0158031 A1 Jun. 30, 2011

Related U.S. Application Data

(60) Provisional application No. 61/101,342, filed on Sep. 30, 2008.

(51) Int. Cl.
*G11C 8/18* (2006.01)

(52) U.S. Cl. ................................ 365/233.1; 365/233.11

(58) Field of Classification Search ............... 365/233.1, 365/233.11; 327/160, 273
See application file for complete search history.

(56) References Cited

U.S. PATENT DOCUMENTS 3,660,781 A 5/1972 Tewksbury et al.
6,326,825 B1 * 12/2001 Walley .......................... 327/160
8,090,335 B1 * 1/2012 Bataineh ....................... 455/260
2003/0042985 A1 * 3/2003 Shibahara et al. .............. 331/17

FOREIGN PATENT DOCUMENTS

DE 4132574 A1 4/1993
DE 4132574 C2 1/1994

OTHER PUBLICATIONS

English Abstract of DE 41 32 574 A1 from ESPACENET, 1 page.
Informal Automated Translation of the Specification for DE 41 32 574 A1 from ESPACENET, 2 pages.

* cited by examiner

*Primary Examiner* — Vu Le

(57) ABSTRACT

In a signal calibration scheme, a desired phase relationship is maintained between a set of signals. For example, in some aspects the desired phase of a clock tree generated from a high speed reference clock signal may be maintained by detecting phase differences between a low speed reference clock signal and low speed clock signals associated with different phases of the clock tree. In some aspects, the desired phase of a clock tree may be maintained by detecting framing offsets that occur through the use of the clock tree.

23 Claims, 11 Drawing Sheets

SIGNAL CALIBRATION METHODS AND APPARATUSES

CLAIM OF PRIORITY

This application claims the benefit of and priority to commonly owned U.S. Provisional Patent Application No. 61/101,342, filed Sep. 30, 2008, the disclosure of which is hereby incorporated by reference herein.

TECHNICAL FIELD

This application relates generally to signal processing and more specifically, but not exclusively, to calibration of timing signals.

BACKGROUND

An electronic device may include circuitry that is controlled by or that utilizes signals that have a defined phase relationship with one another. For example, an electronic device may include different circuits that operate at different speeds. In such a case, a set of clock signals (e.g., a clock tree) may be provided at the device to control the operation of these different circuits. In addition, specific phase relationships may be defined for these clock signals so that the circuits interact with one another in a designated manner.

Under certain circumstances, an electronic device may be unable to maintain the desired phase relationships for a set of signals over time. For example, the phase relationships between different signals of a clock tree that exist after the electronic device is powered on may be different than the phase relationships that existed before the electronic device was powered off.

To maintain such phase relationships over time, the timing circuitry of an electronic device may be left powered on and the electronic device may employ a relatively complicated timing control mechanism such as a phase lock loop. Timing control schemes such as these, however, may consume a relatively large amount of power even when the electronic device is not processing data.

BRIEF DESCRIPTION OF THE DRAWINGS

Sample features, aspects and advantages of the disclosure will be described in the detailed description and appended claims that follow and the accompanying drawings, wherein:

Figure 1:
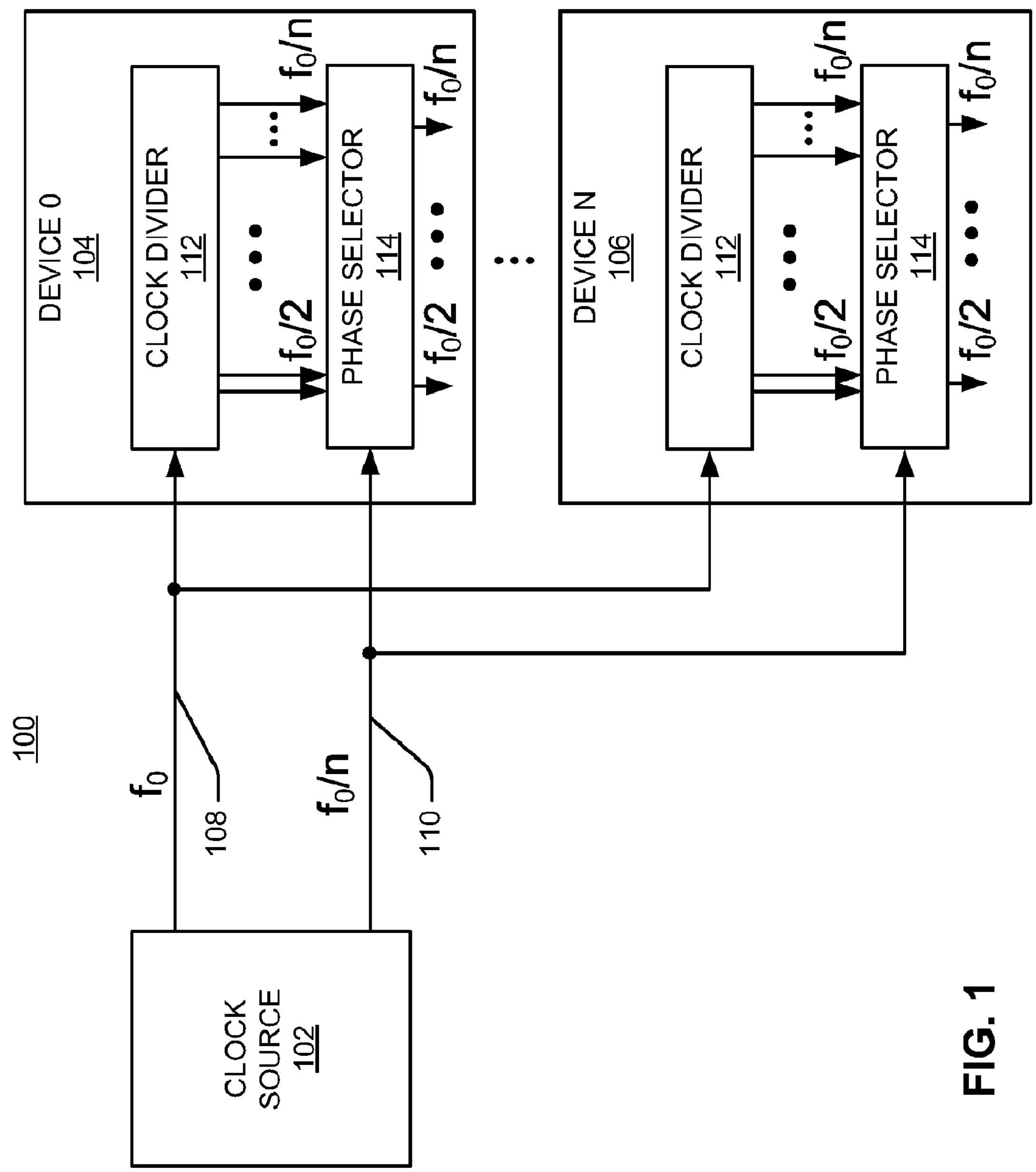
FIG. 1 is a simplified block diagram of an embodiment of a signal processing system constructed in accordance with the teachings herein.

In accordance with common practice the various features illustrated in the drawings may not be drawn to scale. Accordingly, the dimensions of the various features may be arbitrarily expanded or reduced for clarity. In addition, some of the drawings may be simplified for clarity. Thus, the drawings may not depict all of the components of a given apparatus or method. Finally, like reference numerals may be used to denote like features throughout the specification and figures.

DETAILED DESCRIPTION

The description that follows sets forth one or more illustrative embodiments. It should be appreciated that the teachings herein may be embodied in a wide variety of forms and that the embodiments disclosed herein are merely representative. For example, based on the teachings herein one skilled in the art will appreciate that a given structural or functional detail may be incorporated in an embodiment independently of any other structural or functional details. Thus, an apparatus may be implemented or a method practiced using any suitable number of the structural or functional details set forth in any disclosed embodiment(s). Also, an apparatus may be implemented or a method practiced using other structural or functional details in addition to or other than the structural or functional details set forth in any disclosed embodiment(s).

The disclosure relates in some aspects to calibrating signals based on detection of a phase error or other similar error associated with the signals. An error such as this may be detected in various ways. For example, in an apparatus that generates a set of clock signals based on a high speed reference signal, the phase of one or more of the slower speed signals of the set is defined (e.g., selected) based on a comparison of the phase of a slowest speed clock signal of the set with the phase of a slow speed reference clock signal that is associated with the high speed reference clock signal. In addition, in an apparatus where a set of clock signals is used for framing data, the phase of one or more of the slower speed signals of the set is defined (e.g., adjusted) if a framing offset is detected in the framed data. These and other aspects of the disclosure will be briefly described with reference to FIGS. 1 and 2.

FIG. 1 illustrates a system 100 where clock source 102 may be physically separated from one or more devices (e.g., devices 104 and 106). For example, the clock source 102 may be embodied in a different device than the devices 104 and 106. For convenience, the following discussion will focus on the operations of the device 104 rather than the device 106. It should be appreciated, however, that the device 106 and other devices (not shown) in the system 100 may operate in a similar manner as the device 104.

The device 104 may employ locally generated clock signals to, for example, facilitate sending data to and/or receiving data from one or more devices in the system 100 (e.g., a data processing component, not shown, associated with the clock source 102). As a more specific but non-limiting example, serialized data that is synchronized to a high speed reference clock signal 108 may be transferred between the clock source 102 and the device 104.

To facilitate reception and transmission of such data, the device 104 generates local timing signals based on the clock signal 108 and a low speed reference clock signal 110 received from the clock source 102. In a typical implementation, the device 102 generates the clock signal 110 by dividing down the clock signal 108. The local timing generated by the device 104 may comprise multiple clock signals, each of which has a different frequency. For example, a clock divider 112 may successively divide down the clock signal 108 (e.g., having a nominal frequency of f0) to provide a set of clock signals that have nominal frequencies that are divisors of f0 (e.g., f0/2, f0/4, . . . , f0/n). For convenience, a set of clock signals such as this may be referred to herein as a divided clock tree. Here, the term divisor (i.e., factor) means a quantity (which may be an integer or non-integer value) that evenly divides (i.e., integer division) another quantity (an integer or non-integer value). For example, 1.5 Hz is divisor of 6.0 Hz.

For some operations, certain phase relationships need to be maintained between the branches of a divided clock tree. For example, for a specified rising edge of the highest speed branch (e.g., f0), it may be desired that the second highest speed branch (e.g., f0/2) transitions from a low state to a high state and the third highest speed branch (e.g., f0/3) transitions from a high state to a low state.

The device 104 advantageously provides signal calibration such that the locally generated clock signals will automatically reacquire the desired phase relationships even if the device 104 or its clocking circuitry is powered off and back on or if the phase of one or more of these signals is altered by some other event (e.g., a signal glitch). Briefly, the calibration operation involves comparing the phase of the clock signal 110 with the phase of a series of locally generated low speed clock signals that have the same nominal frequency (e.g., f0/n) as the clock signal 110. Based on the results of these phase comparisons, the device 104 then identifies the subset of clock signals that has the desired phase relationship.

As will be described in more detail below, the clock divider 112 generates clocks signal for every possible phase for every branch of a divided clock tree. For example, two signals are generated for each possible phase corresponding to f0/2, four signals are generated for each possible phase corresponding to f0/4, and so on. Thus, in a case where n=4, four phase combinations are generated with each phase combination having a signal associated with f0/2 and a signal associated with f0/4. Each of these phase combinations is thus associated with a corresponding subset of the signals.

A phase selector 114 may then compare the phase of the clock signal 110 with the phase of the lowest speed clock signal in each subset. The subset associated with the smallest phase error is identified as the subset that provides the desired phase relationship. The device 104 thus provides this subset along with the clock signal 108 as the calibrated clock tree.

Figure 2:
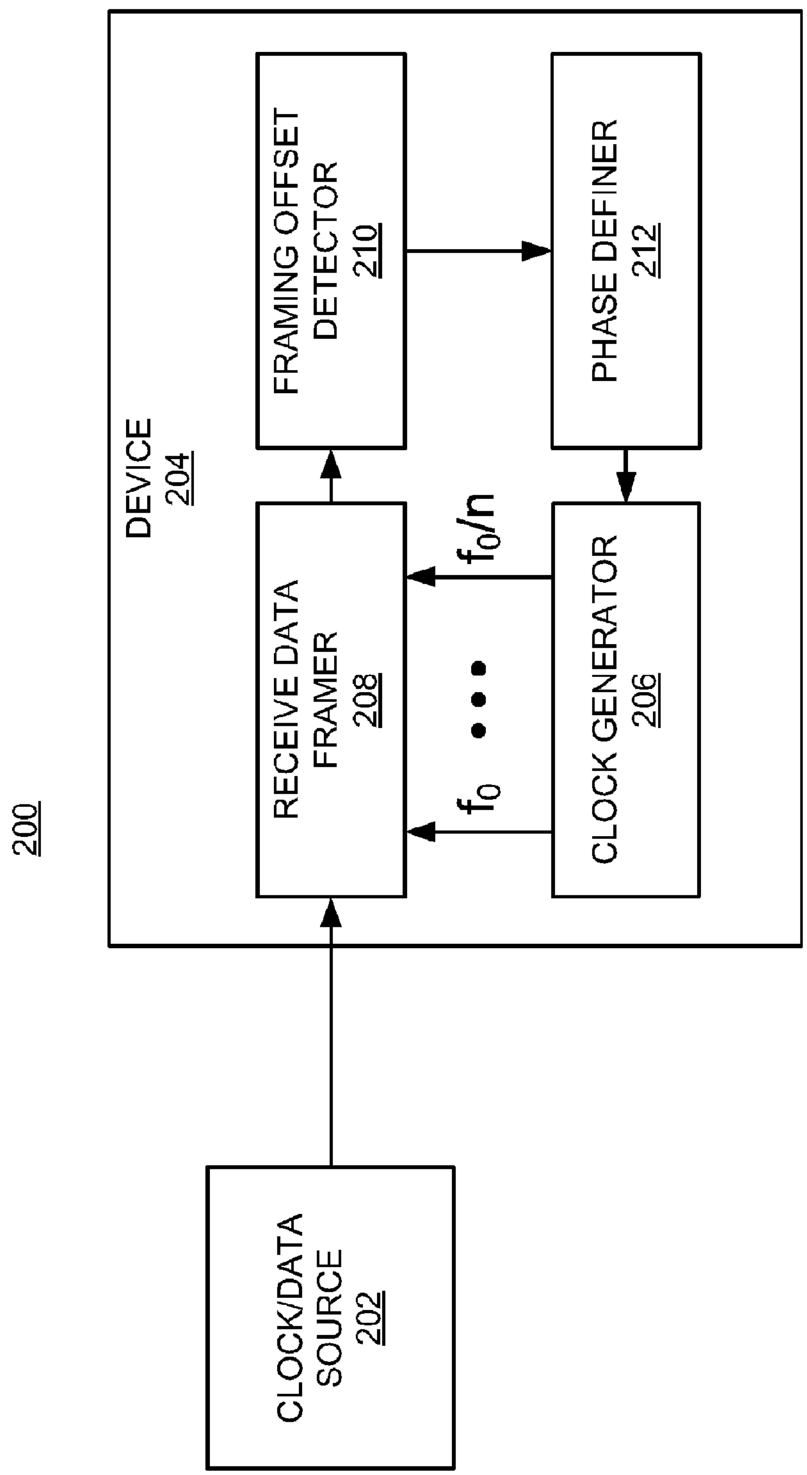
FIG. 2 is a simplified block diagram of an embodiment of a signal processing system constructed in accordance with the teachings herein.

Referring now to FIG. 2, a system 200 includes a clock/data source 202 that may be physically separated from a device 204 (e.g., a peripheral device). For example, the clock/data source 202 may be embodied in a different device than the device 204. In a similar manner as discussed above, the device 204 may include a clock generator 206 that provides locally generated clock signals (designated f0 . . . f0/n) to facilitate sending data to and/or receiving data from one or more devices in the system 200 (e.g., a data processing component, not shown, associated with the clock/data source 202). Also, as discussed above, the device 204 provides signal calibration such that the locally generated clock signals automatically regain the desired phase relationships even if the device 204 or its clocking circuitry is powered off and back on or if the phase of one or more of these signals is altered by some other event (e.g., a signal glitch).

In the example of FIG. 2, the locally generated clock signals are used to frame data received from the clock/data source 202. For example, the timing/data source 202 may send a serialized data stream to the device 204 wherein a receive data framer 208 frames the serialized data (e.g., to provide parallel data). In some aspects, framing may involve defining a starting point and ending point within a volume of data (e.g., according to a defined word boundary). Here, any error in the phase of the clock signals from the clock generator 206 may manifest itself as a framing error in the framed data.

Briefly, the phase calibration operations of the system 200 involve the clock/data source 202 sending a calibration data pattern to the device 204 whereupon the device 204 adjusts the phase of its locally generated clock signals in the event a framing error is detected. As will be described in more detail below, a framing offset detector 210 processes the framed calibration data pattern to determine a framing offset, if any. Such an offset may represent, for example, the number of bit positions between the position where a framing bit was located in a frame (e.g., within a framed pattern of data) and the position where the framing bit was expected to be located in the frame. The framing offset detector 210 may then provide this offset information to a phase definer 212 that cooperates with the clock generator 206 to define (e.g., adjust or select) the phase of the locally generated clock signals.

With the above overview in mind, additional details relating to providing phase calibrated signals will now be described with reference to FIGS. 3-11. Briefly, FIGS. 3 and 4 relate to sample components and operations that may be employed to provide functionality similar to the functionality of the system 100. FIGS. 5-11 relate to sample components and operations that may be employed to provide functionality similar to the functionality of the system 200.

Figure 3:
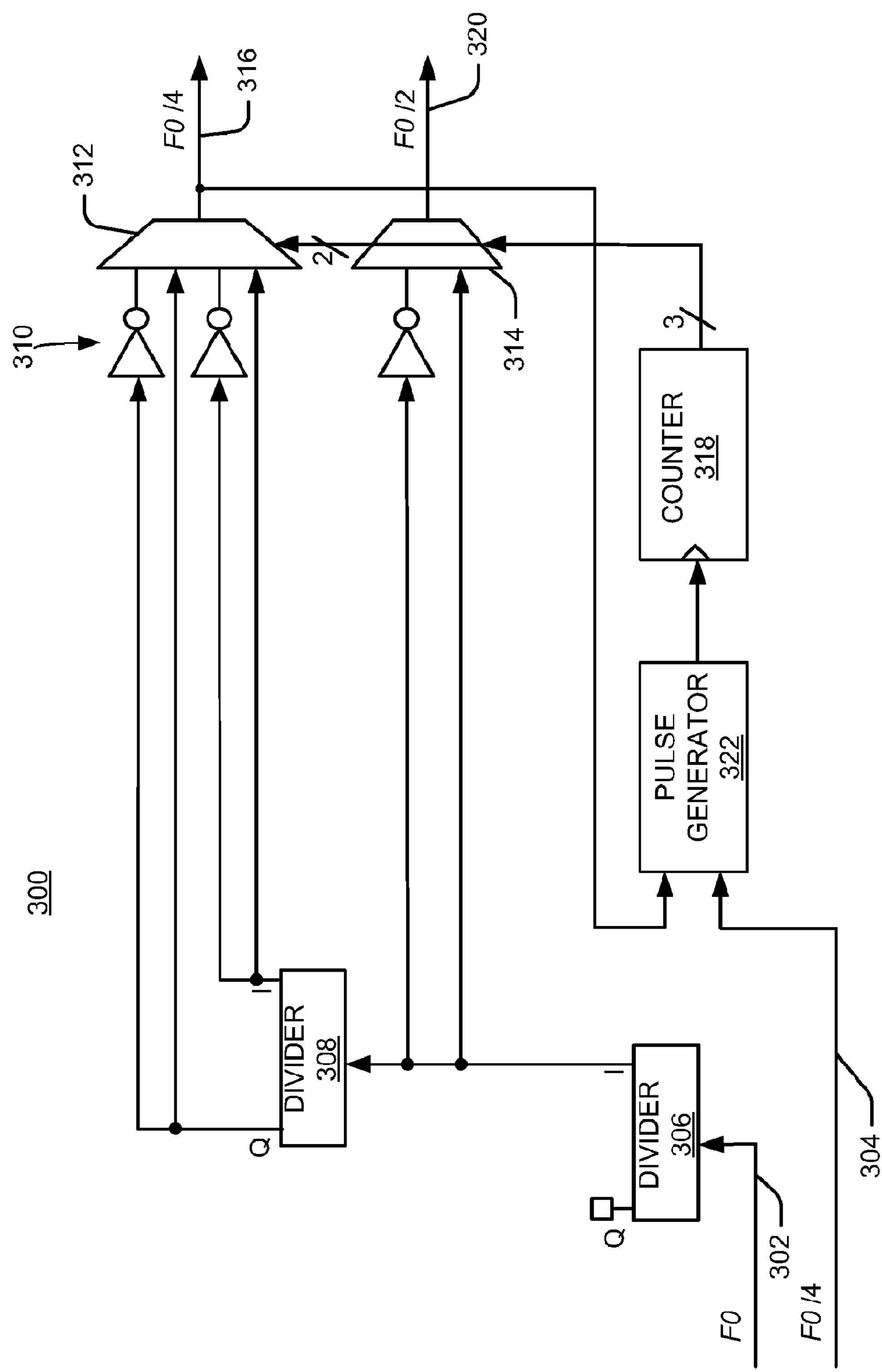
FIG. 3 is a simplified block diagram of an embodiment of a clock generator circuit constructed in accordance with the teachings herein.

FIG. 3 illustrates an embodiment of an apparatus 300 that provides phase calibrated signals. In some aspects, the apparatus 300 may provide the functionality described above for the device 104 of FIG. 1.

Sample operations of the apparatus 300 will be described in conjunction with the flowchart of FIG. 4. For convenience, the operations of FIG. 4 (or any other operations discussed or taught herein) may be described as being performed by specific components (e.g., components of the system 100 and/or the apparatus 300). It should be appreciated, however, that these operations may be performed by other types of components and may be performed using a different number of components. It also should be appreciated that one or more of the operations described herein may not be employed in a given implementation.

Figure 4:
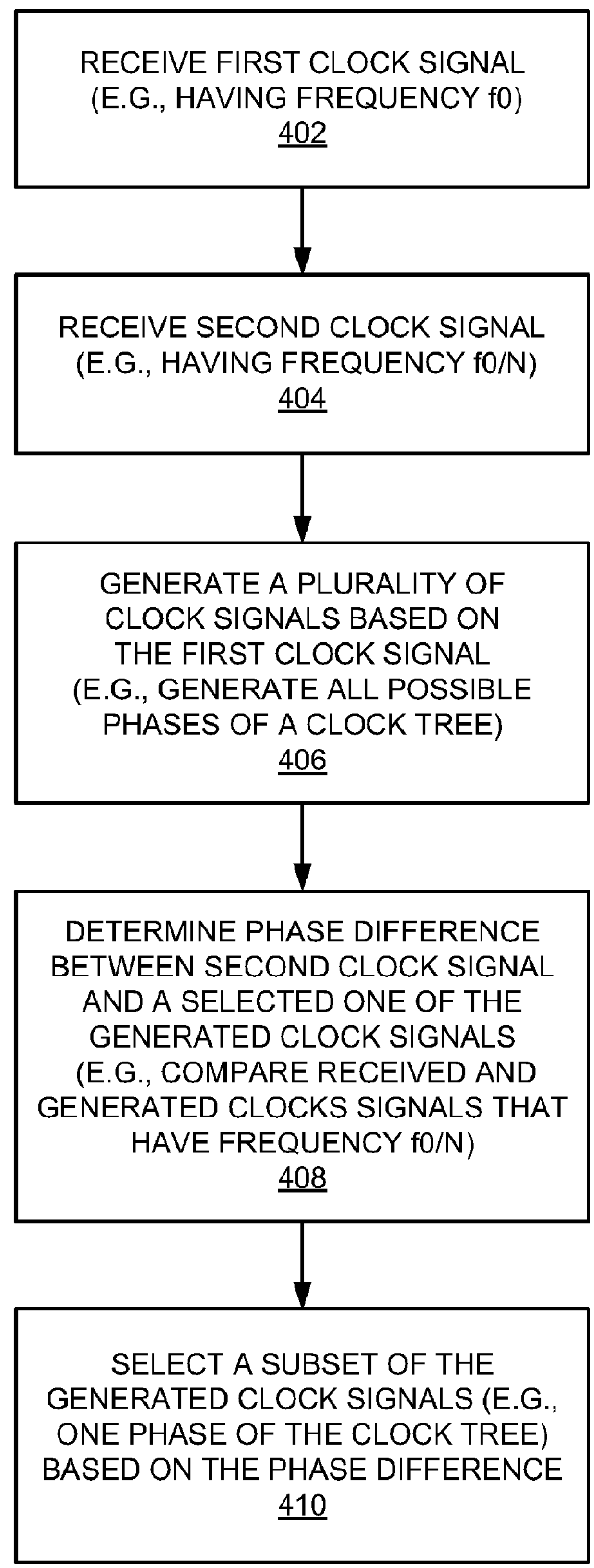
FIG. 4 is a flow chart of an embodiment of operations that may be performed to generate clock signals in accordance with the teachings herein.

As represented by block 402 of FIG. 4, the apparatus 300 receives a first clock signal 302 (e.g., via a signaling interface, not shown) designated in FIG. 3 as having a nominal frequency F0. The first clock signal 302 may be buffered (e.g., not shown) to provide the highest speed clock in a divided clock tree output by the apparatus 300. Thus, the first clock signal 302 may correspond to the clock signal 108 of FIG. 1.

As represented by block 404, the apparatus 300 also receives a second clock signal 304 (e.g., via a signaling interface, not shown) designated in FIG. 3 as having a nominal frequency F0/4. In the example of FIG. 3, the clock tree has three branches (f0, f0/2, and f0/4). Thus, the second clock signal 304 corresponds to the lowest speed clock in the divided clock tree (e.g., corresponding to the clock signal 110 of FIG. 1). It should be appreciated that other embodiments may employ a different number of clock tree branches.

As represented by block 406, the apparatus 300 generates a plurality of clock signals based on the first clock signal 302. For example, the first clock signal 302 is initially divided by a divider 306 to provide a signal having nominal frequency f0/2 and the output of the divider 306 is divided by a divider 308 to provide a signal having nominal frequency f0/4. In addition, through the use of several inverters 310 and appropriate signal paths, the apparatus 300 generates every possible phase for every branch of the divided clock tree. In some aspects, the dividers 306 and 308, the inverters 310, and the associated signal paths may correspond to the clock divider 112 of FIG. 1.

The above signals are provided to a pair of multiplexers 312 and 314. The multiplexer 312 selects one of its four input signals as its output signal 316 based on a pair of control signals from a counter 318. Similarly, the multiplexer 314 selects one of its two input signals as its output signal 320 based on another control signal (e.g., a most significant bit) from the counter 318. Thus, it should be appreciated that as the counter 318 (e.g., a three bit counter) progresses through its count sequence (e.g., from zero to seven), the multiplexers 312 and 314 will successively output the eight different phase relationships that may occur for the signals 316 and 320.

As represented by block 408, a pulse generator 322 determines a phase difference between the second clock signal 304 and the current signal 316. Here, it should be appreciated that these signals will have the same a nominal frequency (e.g., f0/4). In some embodiments, the pulse generator 322 generates a pulse if the phase difference between the two signals is greater than a defined skew tolerance. This skew tolerance may be defined, for example, as a fixed fraction of the period of the clock 302.

The generation of a pulse causes the counter 318 to increment which will, in turn, cause the multiplexers 312 and 314 to output a different subset of clock signals (i.e., having a different phase relationship). The pulse generator 322 may then compare the phases of the new signal 316 and the second signal 304 and generate another pulse if the phase difference is greater than the defined skew tolerance. The above operations may then be repeated until the output of the counter 318 selects a subset of the clock signals that results in no pulse being generated by the pulse generator 322 (e.g., the phase of the current signal 316 is within the defined skew tolerance of the phase of the second clock signal 304). Advantageously, the apparatus 300 will automatically calibrate the divided clock tree if an event occurs that causes the phase relationship of the signals 316 and 320 to not have the desired phase relationship (e.g., as a result of the apparatus 300 be powered off).

As represented by block 410, based on the phase difference between the signal 304 and the signal 316, the apparatus 300 selects a subset of the generated clock signals 316 and 320 that provides the desired phase relationship. In some aspects, the pulse generator 322 and the counter 318 may thus correspond to the phase selector 114 of FIG. 1. These components may be implemented in a variety of ways (e.g., as a state machine).

A clock calibration scheme implemented according to the teachings of FIGS. 1, 3, and 4 may, in one or more aspects, provide more effective calibration than other calibration schemes. For example, the disclosed scheme may require fewer signal interconnects as compared to a scheme that simply routes every branch of a clock tree from a central clock generator to each of the peripheral devices.

In addition, the disclosed scheme may be simpler to implement and provide better performance than a scheme that uses a reset signal to calibrate clock generators at distributed devices. For example, a scheme that uses a reset signal may have a more complex startup sequence, may have tighter timing requirements, and may employ resettable flip-flops (e.g., which may be slower than non-resettable flip-flops). In contrast, the disclosed scheme may employ multiplexers and divider flip-flops that are not controlled by control signals (e.g., reset signals). Consequently, the disclosed scheme may have less stringent setup time constraints. In addition, the disclosed scheme may not employ resettable flip-flops.

Figure 5:
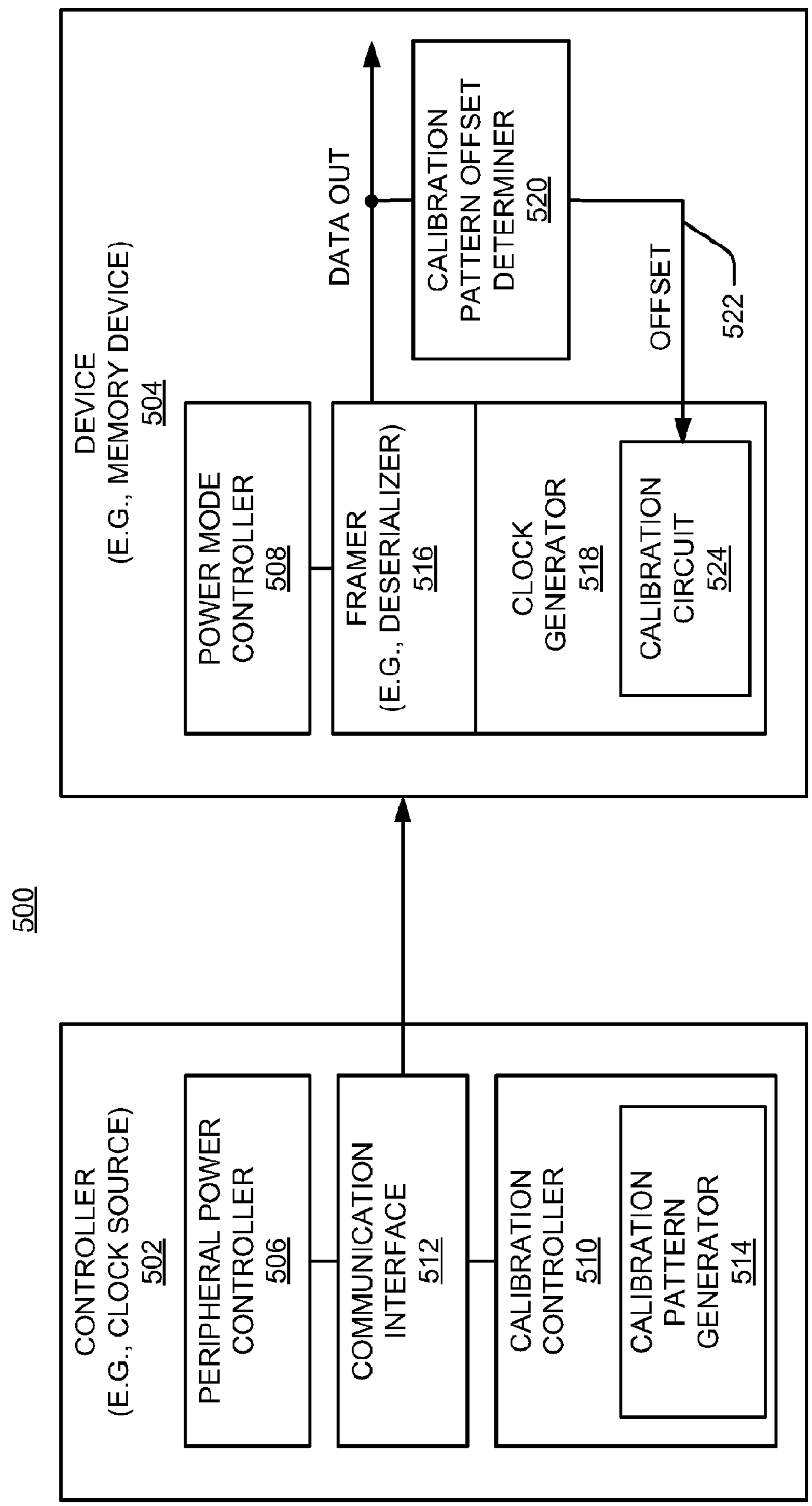
FIG. 5 is a simplified block diagram of an embodiment of a data processing system constructed in accordance with the teachings herein.
Figure 6:
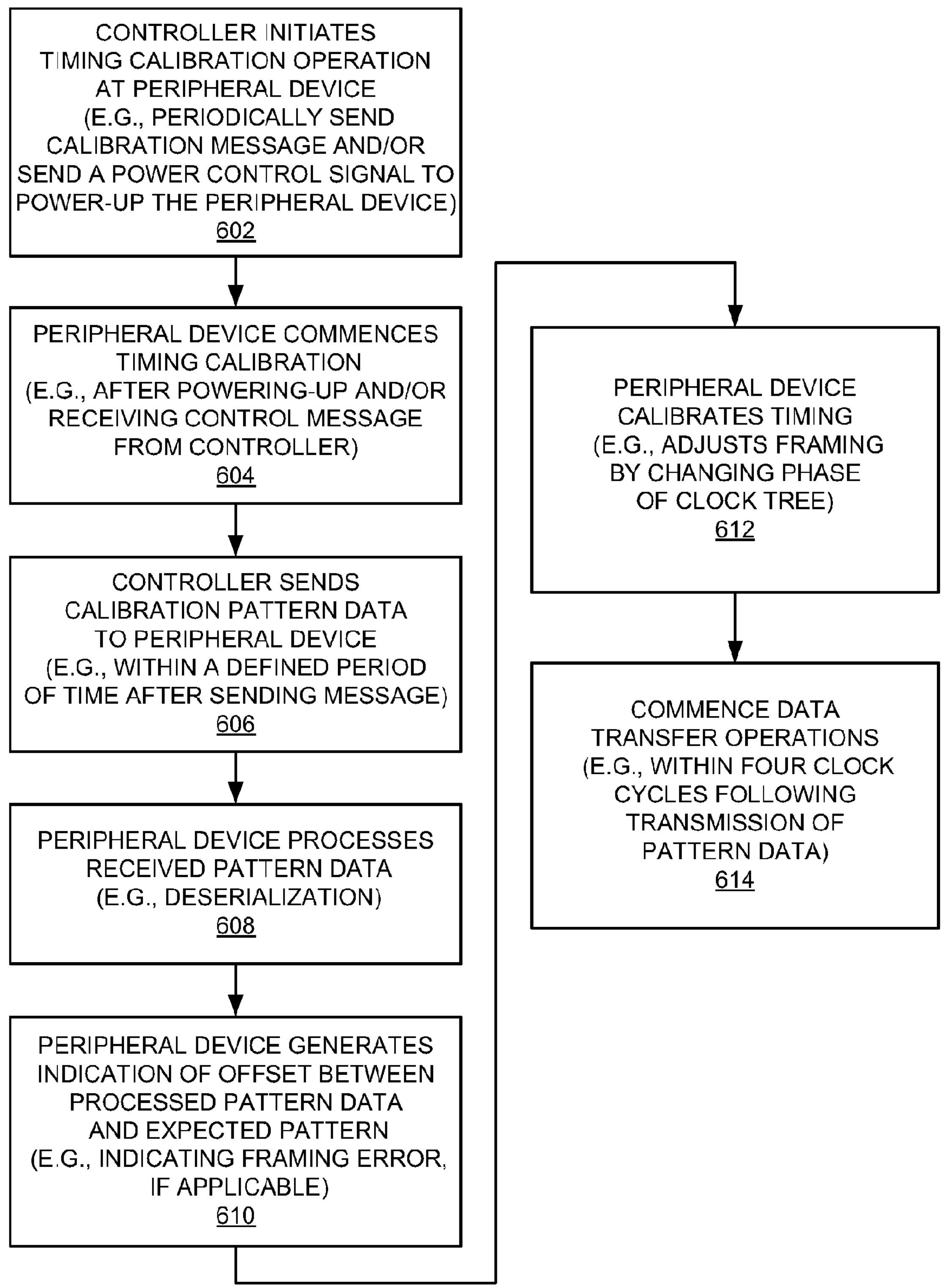
FIG. 6 is a flow chart of an embodiment of operations that may be performed to process data in accordance with the teachings herein.

FIG. 5 illustrates another embodiment of a system that provides calibrated signals. Here, a system 500 includes a controller 502 (e.g., including a clock source, not shown) and an associated device 504 (e.g., a peripheral device such as memory device). In some aspects, the system 500 may provide functionality that is similar to the functionality described above in conjunction with FIG. 2. Sample operations of the apparatus 500 will be described in the context of the flowchart of FIG. 6.

As represented by block 602, the controller 502 may initiate a timing (e.g., phase) calibration operation at the device 504. Such an operation may be initiated in conjunction with a change in the power state (or mode) of the device 504 or in conjunction with calibration operations invoked by the controller 502.

As an example of the former case, a peripheral power controller 506 may cooperate with a power mode controller 508 of the device 504 to control the power state of the device 504. As a specific example, the controller 502 may elect to temporarily power down one or more portions (e.g., a clock generator portion) of the device 504 during an idle mode when data is not being sent to or received from the device 504. Accordingly, at some late point in time the peripheral power controller 506 may send a power control signal to the power mode controller 508 to cause the device 504 to change from a low power mode (e.g., an idle mode) to a higher power mode (e.g., an active mode).

As an example of the calibration operation mentioned above, a calibration controller 510 may repeatedly (e.g., periodically) send calibration messages to the device 504. For example, these operations may be performed during idle periods when data is not being transferred between the controller 502 and the device 504. In this way, the controller 502 may ensure that the device 504 maintains proper timing calibration over time.

As shown in FIG. 5, the controller 502 may include a communication interface 512 (e.g., a signaling interface, a communication processor, or other suitable components) for communicating with the device 504. The device 504 also may include similar circuitry (not shown).

As represented by block 604, the device 504 commences timing calibration operations in response to a given stimulus. For example, as mentioned above these operations may commence after receiving a message from the controller 502. Alternatively, the device 504 may automatically commence these operations (e.g., by continually monitoring for a calibration pattern) after being powered up, reset, or in response to some other event.

As represented by block 606, the calibration controller 510 sends calibration pattern data to the device 504. To this end, the calibration controller 510 may include or cooperate with a calibration pattern generator 514 that generates a data pattern on a defined word boundary (e.g., a byte boundary). It should be appreciated that such a data pattern may take various forms. For example, in a relatively simple case a data pattern may comprise a data value (e.g., a "1") positioned at one or more bit positions within a word boundary. As discussed herein, the controller 502 may send this data to the device 504 in a serialized format. The calibration controller 510 may send the calibration pattern data within a defined period of time after the controller 502 sends the calibration signal or power control signal.

As represented by block 608, the device 504 (e.g., a framer 516) processes the calibration pattern data received from the controller 502. As will be described in more detail in conjunction with FIGS. 7 and 8, this framing operation may comprise a deserialization operation whereby the framer 516 converts received serial data to a parallel data. In some aspects, the framing operation may be based on a set of clock signals generated by a clock generator 518. Also, the framer 516 may output the framed parallel data according to a defined word boundary.

As represented by block 610, a calibration pattern offset determiner 520 processes the framed data pattern to determine whether there is a framing error associated with the framing operation. For example, the calibration pattern offset determiner 520 may compare a value of the framed data pattern with an expected data value. As mentioned above, this operation may involve comparing the actual position of one or more data values within the framed data pattern (e.g., associated with a word boundary as defined relative to an edge of a clock signal) with an expected position for each data value within the framed data pattern.

The calibration pattern offset determiner 520 then generates an indication 522 relating to the offset detected a block 610. For example, if there is no framing error, the calibration pattern offset determiner 520 may output an offset value of "0." If the framing was off by one bit, the calibration pattern offset determiner 520 may output an offset value of "1," and so on.

As represented by block 612, a calibration circuit 524 calibrates the signal timing of the device 504 based on the offset 522. For example, as will be described in more detail in conjunction with FIGS. 7 and 8, the calibration circuit 524 may define the phase of one or more of the clock signals generated by the clock generator 518 so that the framer 516 correctly frames received data.

As represented by block 614, once the device 504 is calibrated, the controller 502 and the memory device 504 may commence data transfer operations. As discussed below, the device 504 may advantageously compensate for any phase error (e.g., due to a transition to a low power mode) in a single operation. Consequently, the controller 502 and the device 504 may commence data transfer operations within a relatively short period of time after the device 504 receives the calibration pattern data (e.g., within four clock cycles of the highest speed clock associated with transmitted data).

Figure 7:
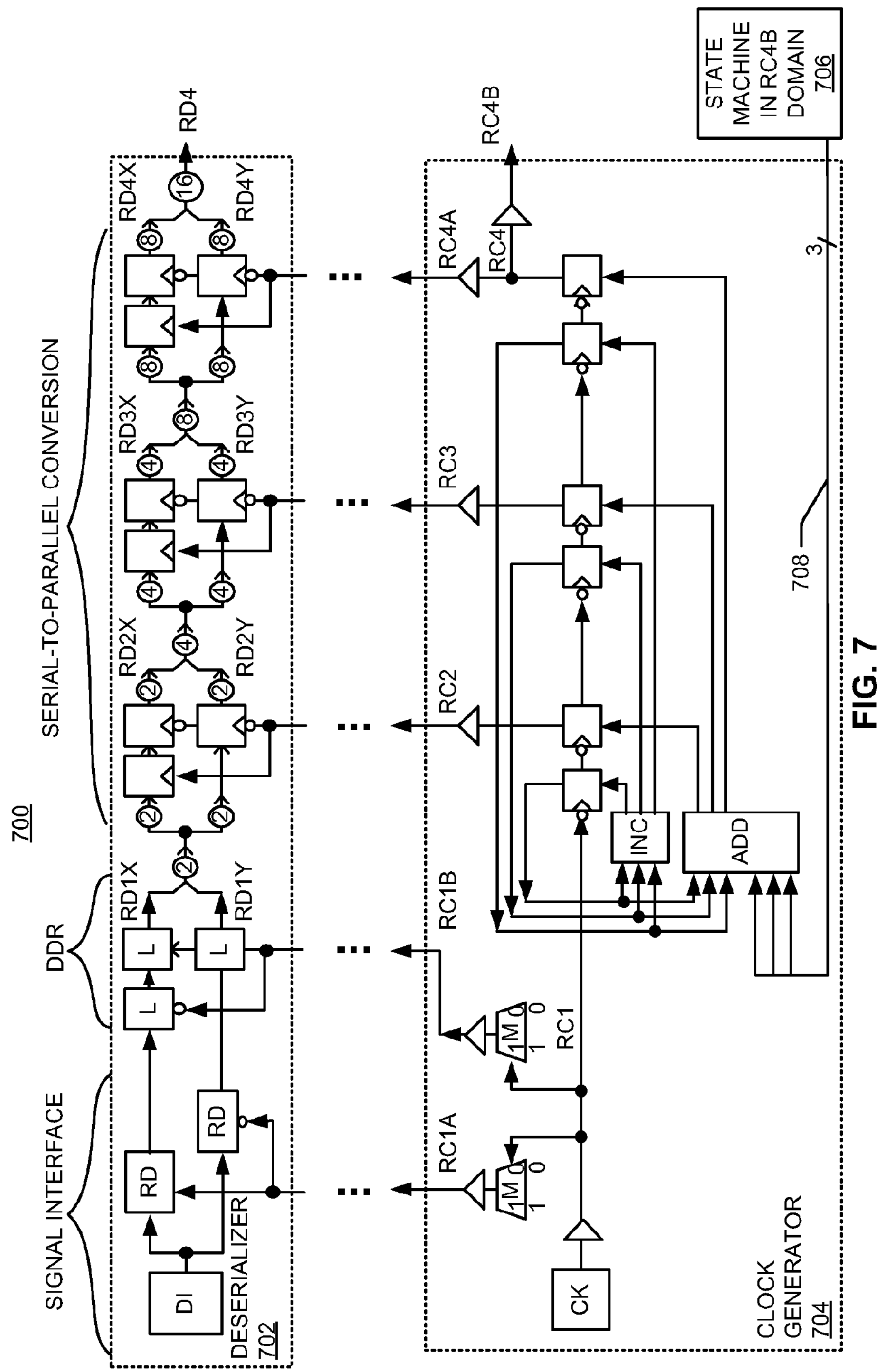
FIG. 7 is a simplified block diagram of an embodiment of a data processing and clock generator circuit constructed in accordance with the teachings herein.

FIG. 7 illustrates an embodiment of an apparatus 700 (e.g., a circuit) that provides phase calibrated signals. In some aspects, the apparatus 700 may provide some of the functionality described above for the device 504 of FIG. 2. For example, a deserializer 702 may provide functionality relating to the framer 516, a clock generator 704 may provide functionality relating to the clock generator 518, and a state machine 706 may provide functionality relating to the calibration pattern offset determiner 520.

The deserializer 702 includes several signal interface components that facilitate receiving data (e.g., from the controller 502). Here, signals may be received via one or more pads (designated DI) and provided to receiver components (designated RD) such as signal buffers. FIG. 7 also illustrates an implementation that incorporates dual data rate ("DDR") signaling components, that clock-in data on both edges of a receive clock (buffered clock RC1B in this example).

The deserializer 702 also includes serial-to-parallel conversion components that convert 2-bit wide data (RD1X and RD1Y) into a 16-bit wide data (RD4X and RD4Y). Here, it may be seen that the serial-to-parallel operation is performed by three stages. A first stage converts the 2-bit wide data (RD1X and RD1Y) into 4-bit wide data (RD2X and RD2Y) by operation of a clock RC2 that operates at half the frequency of RC1. A second stage converts the 4-bit wide data (RD2X and RD2Y) into 8-bit wide data (RD3X and RD3Y) by operation of a clock RC3 that operates at half the frequency of RC2. A third stage converts the 8-bit wide data (RD3X and RD3Y) into 16-bit wide data (RD4X and RD4Y) by operation of a clock RC4 (e.g., RC4A) that operates at half the frequency of RC3.

The clock generator 704 employs control loop that includes an incrementer component (designated INC) and three register stages (each comprising two flip-flops) to provide the divided clock tree RC1-RC4. The incrementer generates input signals for the three register stages. For example, the incrementer may comprise a 3-bit counter that repeatedly counts from 0 to 7, thereby maintaining word alignment state for the apparatus 700. Here, the most significant bit of the count is provided to the rightmost (third) stage and the least significant bit of the count is provided to the leftmost (first) stage. Thus, the first stage generates the clock RC2 with a clock rate that is half the clock rate of RC1. A second stage generates the clock RC3 with a clock rate that is half the clock rate of RC2. The third stage generates the clock RC4 with a clock rate that is half the clock rate of RC3.

The clock generator 704 also includes an adder component (designated ADD) that enables the phase of the divided clock tree to be defined based on the value of word alignment offset signal 708 provided by the state machine 706. Sample operations of these components will be described in conjunction with the simplified timing diagram of FIG. 8.

To reduce the complexity of FIG. 8, these operations will be described in the context of a 3-bit divided clock tree (e.g., only RC1-RC3) rather than the 4-bit clock tree shown in FIG. 7. Thus, in FIG. 8 the incrementer is shown as repeatedly counting from 0-3. In addition, the word alignment offset signal 708 (e.g., as output by a word alignment register in the state machine 706) is a 2-bit signal.

Figure 8:
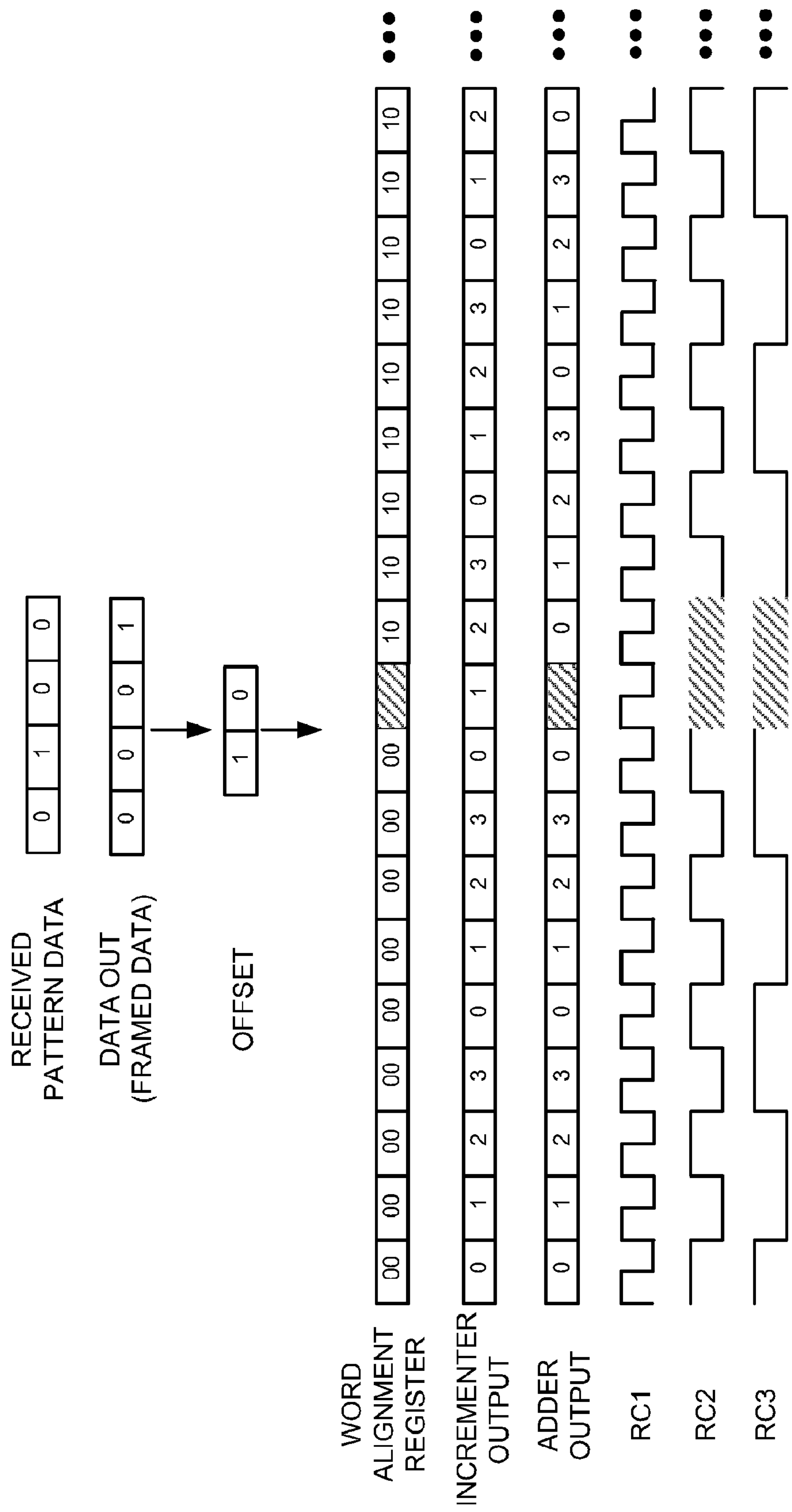
FIG. 8 is a simplified diagram of an embodiment of timing operations that may be employed to adjust the phase of a set of clock signals.

As illustrated by the timing on left hand side of FIG. 8, when there is no framing error (e.g., the output of the word alignment register is "00"), the output of the adder tracks the output of the incrementer. FIG. 8 illustrates a sample phase relationship for RC1-RC3 under these conditions.

As represented by the received pattern data at the top of FIG. 8, at some point in time the deserializer 702 receives calibration data. In this simplified example, the data is defined on a 4-bit word boundary.

As represented by the output data at the top of FIG. 8, during a framing operation a framing error may occur due to an incorrect phase relationship of the clock signals RC1-RC3. In this case, the framing error is 2-bits. Accordingly, the state machine 706 may change the value of the word alignment register to "10" and this value is provided to the adder. As indicated by the right hand side of FIG. 8, the output of the adder is adjusted to reflect the addition of the word alignment offset signal 708 to the count from the incrementer. Moreover, the resulting adjusted count value provided to the register stages (e.g., the clock divider) induces the desired change in phase for the clock signals (e.g., RC2 and RC3). As a result, subsequent framing operations will no longer result in a framing error since the offset value may not be changed until another framing error is detected (e.g., during a subsequent calibration test).

Advantageously, the apparatus 700 may provide phase calibration (and associated word alignment or framing adjustment) via a single alignment measurement and a single alignment adjustment. As a result, the apparatus 700 may perform a calibration operation very quickly. For example, once a new offset value is calculated, the clock phase may be adjusted within a single clock cycle of the highest speed clock (e.g., RC1).

FIG. 7 also illustrates that the word alignment state of the apparatus 700 is effectively decoupled from the word alignment offset. As FIG. 8 illustrates, the incrementer output (associated with the word alignment state) is not affected by the change in the word alignment offset signal 708. The word alignment offset may thus be changed without needing to take into consideration any effect this may have on the current word alignment state. As a result, the word alignment offset may be implemented with less complexity as compared to, for example, an implementation where the word alignment state has to synchronize any changes in the offset with timing events in the word alignment state. Such synchronization may be particularly complex given that the update logic (e.g., the state machine 706 that updates the offset value) operates in a relatively slow clock domain (e.g., RC4B) and the word alignment logic (e.g., the incrementer) operates in a much faster clock domain (e.g., RC1).

Figure 9:
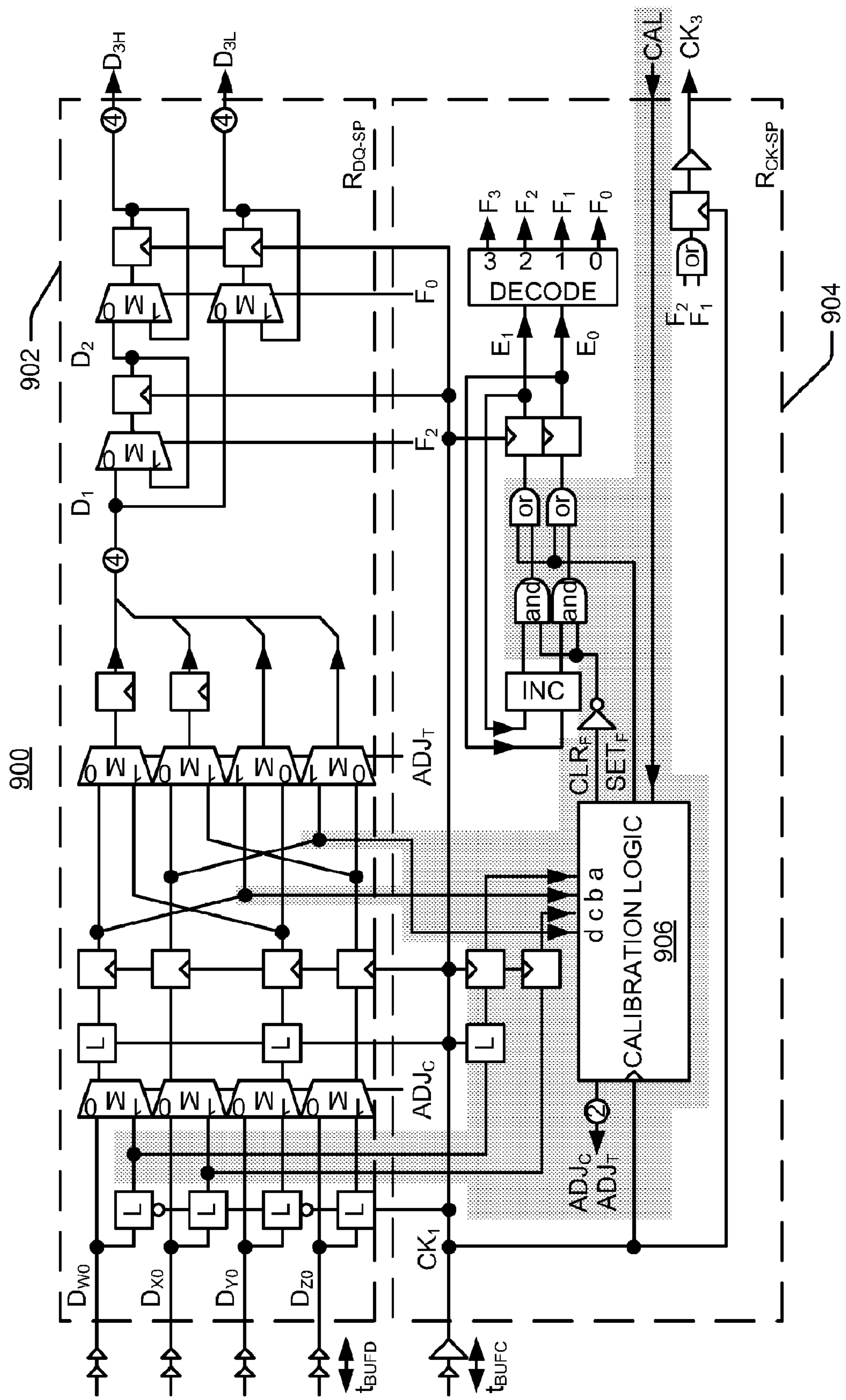
FIG. 9 is a simplified block diagram of an embodiment of a data processing and clock generator circuit constructed in accordance with the teachings herein.

Another example of a calibration circuit will be described with reference to FIG. 9. Here, an apparatus 900 includes serial-to-parallel logic (the $R_{DQ\_SP}$ block 902) and a clock generator and phase calibration circuit (the $R_{cK\_SP}$ block 904).

Figure 10:
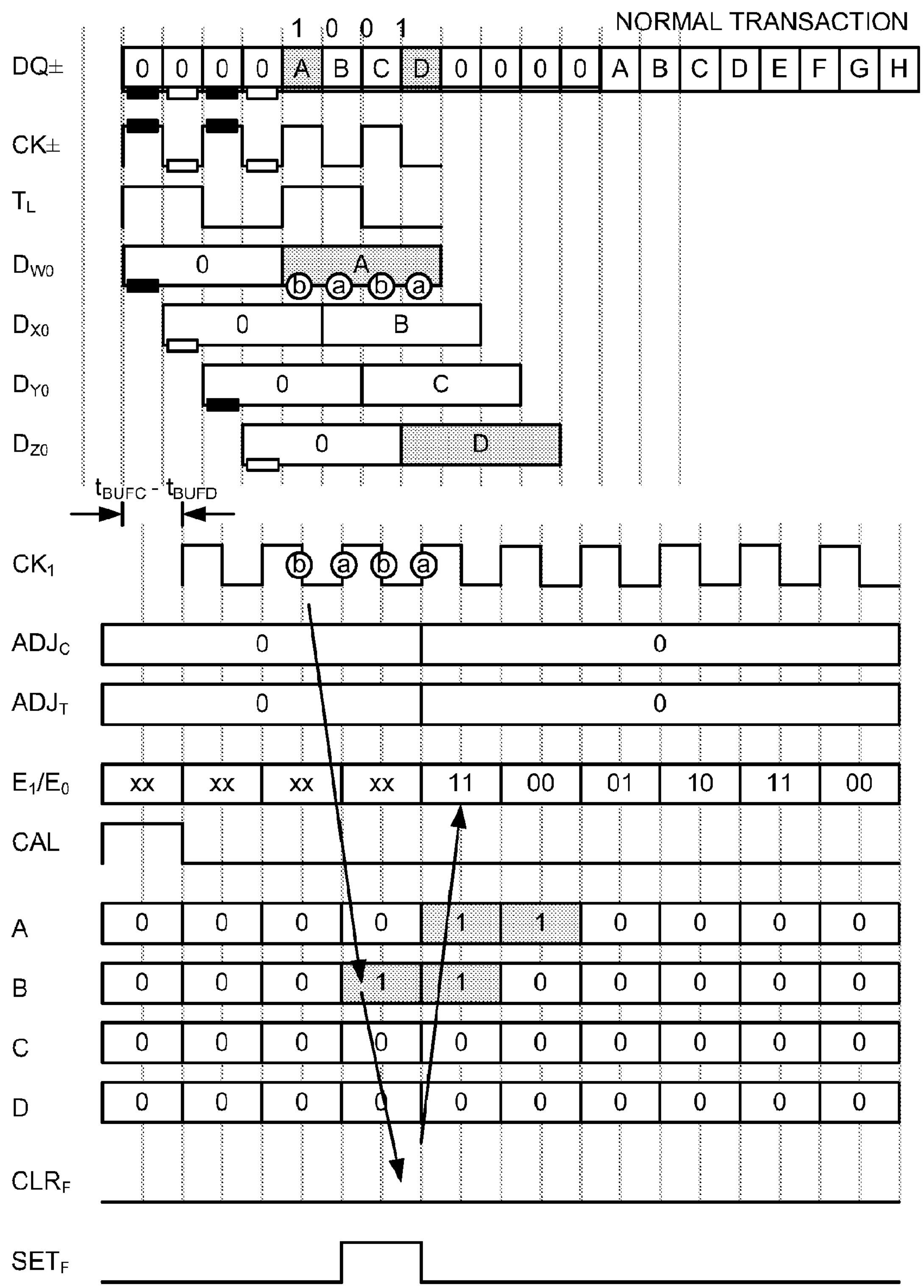
FIG. 10 is a simplified diagram of an embodiment of timing operations that may be employed to calibrate a set of signals.

Referring to the associated timing diagram of FIG. 10, a received DDR serial stream DQ± is clocked-in by a clock CK± to provide input data $D_{W0}$-$D_{Z0}$ (left hand side of FIG. 9) for the block 902. This data is latched via a clock $CK_1$ and provided to a multiplexer stage controlled by control signals $ADJ_C$ and $ADJ_T$, whereby one of the four input data signals is output as data $D_1$. This data is then provided to a parallelization stage (right hand side of block 902) that is controlled by clocks $F_0$ and $F_2$.

The clock generator block 904 includes word alignment state logic that is similar in some aspects to the word alignment logic of the apparatus 700. For example, an incrementer (inc) loop generates a count ($E_1$ and $E_0$) that is used to generate the clock signals $F_0$-$F_3$.

Figure 11:
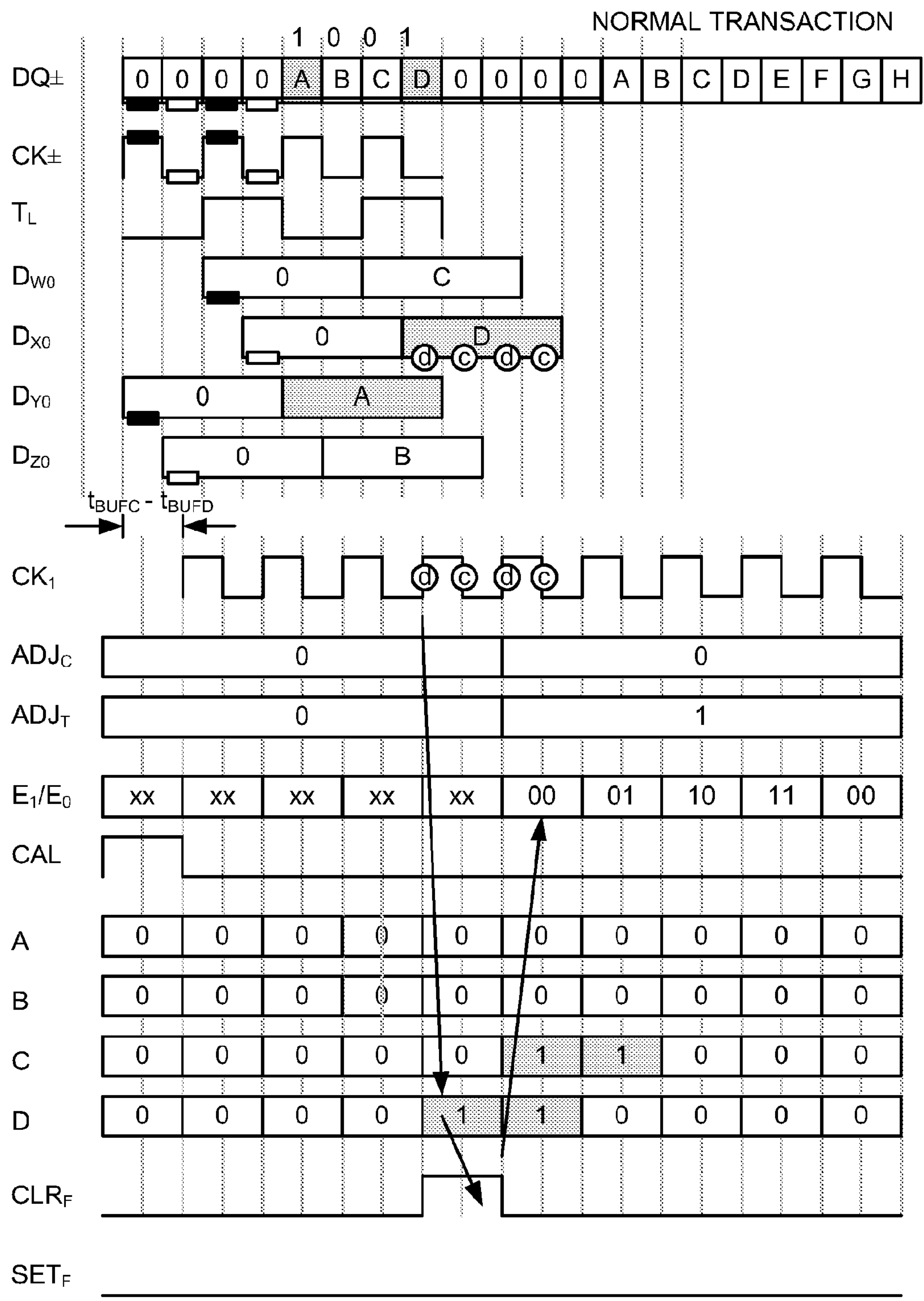
FIG. 11 is a simplified diagram of an embodiment of timing operations that may be employed to calibrate a set of signals.

The clock generator 904 includes calibration logic 906 that operates in conjunction with the circuitry indicated by the shading. Here, a clear signal $CLR_F$ and a set signal $SET_E$ are ANDed and ORed into the incrementing loop, respectively, to adjust the phase of the clocks $F_0$-$F_3$. FIG. 10 illustrates an example of how data moves through the apparatus 900. FIG. 11 illustrates an example of an adjustment cycle that detects an alignment error (as shown by $D_{W0}$-$D_{Z0}$) and adjusts the phase so that the desired synchronization is achieved.

In view of the above, it should be appreciated that signal calibration may be accomplished at a remote device through the use of a control loop (e.g., framing error detection→offset generation→framing clock phase adjustment) that is implemented entirely at the remote device. Moreover, such a control loop may be closed on a repeated basis to maintain the desired signal synchronization over time.

Furthermore, the teachings herein may be effectively employed in a low power and/or a low cost device that does not include a relatively complex (and high power) clock circuit such as a phase lock loop. Rather, the teachings herein may be used to provide effective calibration in the event the timing (e.g., data alignment) variability associated with framing or other operations exceeds a bit time (e.g., of the highest speed clock).

It should be appreciated that various modifications may be made to the disclosed embodiments based on the teachings herein. For example, different embodiments may utilize a different number of clock signals. In such cases, appropriate circuitry may be added or removed to provide the desired functionality. In addition, the teachings herein may be employed to generate clock signals that are used for purposes other than those described above. For example, the teachings herein may be applicable to an apparatus that generates clock signals for serialization operations (e.g., framing operations relating to converting parallel data to serial data for transmission to another device) or other operations.

The teachings herein may be employed in a variety of applications. In some embodiments the teachings herein may be employed in a memory system. For example, the functionality of the clock source 102 of FIG. 1 may be implemented in a memory controller while the functionality of the device 104 and the apparatus 300 may be implemented in one or more memory devices. Similarly, the functionality of the clock/data source 202 and the controller 502 may be implemented in a memory controller while the functionality of the device 204 and the device 504 (and the functionality of FIGS. 7 and 9) may be implemented in one or more memory devices. Here, a memory device may generate calibrated clock signals to, for example, clock data into and/or out of the memory device.

In some aspects, a memory device may comprise a semiconductor integrated circuit device that includes a set of storage cells, which may collectively provide a memory array or a portion of a memory array. Examples of such memory devices include volatile memory devices, nonvolatile memory devices, DRAMs, SRAMs, and flash memory devices. In some aspects, a memory device may comprise a memory module (e.g., including one or more DRAMs or other memory components).

A memory system may be used in a variety of applications. For example, a memory system may be incorporated into a computer graphics card, a videogame console, a printer, a personal computer, a server, or some other apparatus that utilizes data storage.

It also should be appreciated that the various structures and functions described herein may be implemented in various ways and using a variety of apparatuses. For example, a device may be implemented by various hardware components such as a processor, a controller, a state machine, logic, or some combination of one or more of these components.

In some embodiments, code including instructions (e.g., software, firmware, middleware, etc.) may be executed on one or more processing devices to implement one or more of the described functions or components. The code and associated components (e.g., data structures and other components by the code or to execute the code) may be stored in an appropriate data memory that is readable by a processing device (e.g., commonly referred to as a computer-readable medium).

The recited order of the blocks in the processes disclosed herein is simply an example of a suitable approach. Thus, operations associated with such blocks may be rearranged while remaining within the scope of the present disclosure. Similarly, the accompanying method claims present operations in a sample order, and are not necessarily limited to the specific order presented.

The components and functions described herein may be connected or coupled in various ways. The manner in which this is done may depend, in part, on whether and how the components are separated from the other components. In some embodiments some of the connections or couplings represented by the lead lines in the drawings may be in an integrated circuit, on a circuit board or implemented as discrete wires, or in some other way.

The signals discussed herein may take various forms. For example, in some embodiments a signal may comprise electrical signals transmitted over a wire, light pulses transmitted through an optical medium such as an optical fiber or air, or RF waves transmitted through a medium such as air, etc. In addition, a plurality of signals may be collectively referred to as a signal herein. The signals discussed above also may take the form of data. For example, in some embodiments an application program may send a signal to another application program. Such a signal may be stored in a data memory.

Also, it should be understood that any reference to an element herein using a designation such as "first," "second," and so forth does not generally limit the quantity or order of those elements. Rather, these designations may be used herein as a convenient method of distinguishing between two or more elements or instances of an element. Thus, a reference to first and second elements does not mean that only two elements may be employed there or that the first element must precede the second element in some manner. Also, unless stated otherwise a set of elements may comprise one or more elements.

While certain sample embodiments have been described above in detail and shown in the accompanying drawings, it is to be understood that such embodiments are merely illustrative of and not restrictive of the teachings herein. In particular, it should be recognized that the teachings herein may apply to a wide variety of apparatuses and methods. It will thus be recognized that various modifications may be made to the illustrated and other embodiments as taught herein, without departing from the broad inventive scope thereof. In view of the above it will be understood that the teachings herein are not limited to the particular embodiments or arrangements disclosed, but are rather intended to cover any changes, adaptations or modifications which are within the scope of the appended claims.

What is claimed is:

1. A method of signal calibration, comprising:

receiving a first clock signal having a first nominal frequency;

receiving a second clock signal having a second nominal frequency that is a divisor of the first nominal frequency;

generating a plurality of clock signals based on the first clock signal, wherein the generated clocks signals include a third clock signal having the second nominal frequency;

determining a phase difference between the second clock signal and the third clock signal; and selecting, based on the phase difference, one subset of a plurality of subsets of the generated clock signals.

2. The method of claim 1, wherein the subsets define different clock phase relationships.

3. The method of claim 1, wherein, if the phase difference is less than or equal to a defined skew tolerance, the selected subset is a subset that includes the third clock signal.

4. The method of claim 1, wherein, if the phase difference is greater than or equal to a defined skew tolerance, the selected subset is a subset that does not include the third clock signal.

5. The method of claim 1, wherein the plurality of clock signals have frequencies that are divisors of the first nominal frequency.

6. The method of claim 1, further comprising generating a pulse if the phase difference is greater than a defined skew tolerance, wherein:

the pulse causes a counter to increment; and the output of the counter is provided to select the one subset.

7. The method of claim 6, wherein:

the generated clock signals are provided to inputs of at least one multiplexer; and the output of the counter is provided to the at least one multiplexer to select the one subset.

8. The method of claim 6, further comprising repeatedly generating the pulse to change the output of the counter until a desired one of the subsets is selected to thereby provide calibrated clock signals.

9. The method of claim 1, wherein the plurality of clock signals are generated in a memory device to clock data into and/or out of the memory device.

10. The method of claim 9, wherein the memory device comprises a DRAM.

11. The method of claim 9, wherein the memory device comprises a memory module.

12. An apparatus for signal calibration, comprising:

a clock divider configured to:

receive a first clock signal having a first nominal frequency, and generate a plurality of clock signals based on the first clock signal, wherein the generated clocks signals include a third clock signal having a second nominal frequency that is a divisor of the first nominal frequency; and a phase selector configured to:

receive a second clock signal having the second nominal frequency, determine a phase difference between the second clock signal and the third clock signal, and select, based on the phase difference, one subset of a plurality of subsets of the generated clock signals.

13. The apparatus of claim 12, wherein the subsets define different clock phase relationships.

14. The apparatus of claim 12, wherein the phase selector is further configured to select a subset that includes the third clock signal if the phase difference is less than a defined skew tolerance.

15. The apparatus of claim 12, wherein the phase selector is further configured to select a subset that does not include the third clock signal if the phase difference is greater than a defined skew tolerance.

16. The apparatus of claim 12, wherein the plurality of clock signals have frequencies that are divisors of the first nominal frequency.

17. The apparatus of claim 12, wherein:

the phase selector is further configured to generate a pulse if the phase difference is greater than a defined skew tolerance;

the phase selector comprises a counter;

the pulse is provided to increment the counter; and the output of the counter is provided to select the one subset.

18. The apparatus of claim 17, wherein:

the generated clock signals are provided to inputs of at least one multiplexer of the phase selector; and the output of the counter is provided to the at least one multiplexer to select the one subset.

19. The apparatus of claim 17, wherein the phase selector is further configured to repeatedly generate the pulse to change the output of the counter until a desired one of the subsets is selected to thereby provide calibrated clock signals.

20. The apparatus of claim 12, wherein:

the apparatus comprises a memory device; and the plurality of clock signals are generated to clock data into and/or out of the memory device.

21. The apparatus of claim 20, wherein the memory device comprises a DRAM.

22. The apparatus of claim 20, wherein the memory device comprises a memory module.

23. An apparatus for signal calibration, comprising:

means for receiving a first clock signal having a first nominal frequency;

means for receiving a second clock signal having a second nominal frequency that is a divisor of the first nominal frequency;

means for generating a plurality of clock signals based on the first clock signal, wherein the generated clocks signals include a third clock signal having the second nominal frequency;

means for determining a phase difference between the second clock signal and the third clock signal; and means for selecting, based on the phase difference, one subset of a plurality of subsets of the generated clock signals.

* * * * *